(12) United States Patent
Neugebauer et al.

(10) Patent No.: US 8,681,459 B2
(45) Date of Patent: Mar. 25, 2014

(54) INTEGRATED PROTECTION CIRCUIT

(75) Inventors: Kurt Neugebauer, Vaterstetten (DE); Andreas Roth, Guenzenhausen (DE)

(73) Assignee: Freescale Semiconductor, Inc., Austin, TX (US)

( * ) Notice: Subject to any disclaimer, the term of this patent is extended or adjusted under 35 U.S.C. 154(b) by 21 days.

(21) Appl. No.: 13/202,775

(22) PCT Filed: Mar. 31, 2009

(86) PCT No.: PCT/IB2009/051348
§ 371 (c)(1),
(2), (4) Date: Aug. 23, 2011

(87) PCT Pub. No.: WO2010/112971
PCT Pub. Date: Oct. 7, 2010

(65) Prior Publication Data
US 2012/0039009 A1 Feb. 16, 2012

(51) Int. Cl.
*H02H 3/22* (2006.01)
(52) U.S. Cl.
USPC .............................................. 361/56; 361/111
(58) Field of Classification Search
USPC .................................................... 361/56, 111
See application file for complete search history.

(56) References Cited

U.S. PATENT DOCUMENTS

| | | | |
|---|---|---|---|
| 3,777,216 A | 12/1973 | Armstrong | |
| 4,423,431 A | 12/1983 | Sasaki | |
| 6,046,894 A | 4/2000 | Ida | |
| 6,611,407 B1 | 8/2003 | Chang | |
| RE38,319 E | 11/2003 | Lin et al. | |
| 2002/0153533 A1 | 10/2002 | Okushima | |
| 2002/0195648 A1 | 12/2002 | Hirata | |
| 2005/0018370 A1 | 1/2005 | Arai et al. | |
| 2006/0209479 A1* | 9/2006 | Grombach et al. | 361/56 |
| 2008/0043388 A1 | 2/2008 | Kohama | |
| 2008/0259511 A1* | 10/2008 | Worley | 361/56 |
| 2009/0073620 A1* | 3/2009 | Mergens et al. | 361/56 |
| 2009/0323236 A1* | 12/2009 | Morishita | 361/56 |

FOREIGN PATENT DOCUMENTS

| KR | 20020045016 A | 6/2002 |
|---|---|---|
| KR | 20050074006 | 7/2005 |

OTHER PUBLICATIONS

International Search Report and Written Opinion correlating to PCT/IB2009/051348 dated May 25, 2011.

* cited by examiner

*Primary Examiner* — Danny Nguyen

(57) ABSTRACT

An integrated protection circuit for protecting a main circuit from spurious high amplitude voltage signals is provided, wherein the main circuit has a main circuit input terminal connected to an input line, and the protection circuit comprises a transistor, a resistor and a capacitor. The transistor has a first electrode connected to the input line, a second electrode connected to a common reference, and a control electrode connected to the resistor. The resistor is connected to the common reference; and the capacitor is implemented as a fringe capacitor between the input line and the control electrode or a conductive line connected to the control electrode.

18 Claims, 5 Drawing Sheets ic field. ESD may for example be caused by human
INTEGRATED PROTECTION CIRCUIT

FIELD OF THE INVENTION

This invention in general relates to integrated circuits and more specifically to an integrated protection circuit for protecting a main circuit from spurious high amplitude voltage signals.

BACKGROUND OF THE INVENTION

An integrated circuit (IC) chip may become permanently damaged by peak voltages applied to the chip. For example, an oxide layer isolating a gate electrode of a metal-oxide semiconductor field effect transistor may be corrupted when receiving a spurious high-amplitude voltage spike. Such damage may be caused by excessive electrostatic discharge (ESD), when the gate electrode is connected to an external terminal or pin of the IC. ESD is a sudden and momentary electric current that flows between two objects at different electrical potentials caused by direct contact or induced by an electrostatic field. ESD may for example be caused by human handling of the chip. It can result from electrostatic electricity, for example caused by tribocharging or by electrostatic induction when an electrically charged object is placed near a conductive object isolated from ground. An ESD event may occur when this object comes into contact with a conductive path.

Due to size reduction in IC technologies, reduction of layer sizes has increased circuit sensitivity against ESD. Therefore, ESD protection has become an important focus of circuit development. However, applicability of active ESD protection structures having transistors is limited to a certain range of tolerable voltage amplitudes before damaging the protection circuits.

In U.S. Pat. No. 3,777,216, an avalanche injection input protection circuit is described. As shown in FIG. 1, a circuit 10 is provided for protecting an insulated gate field-effect transistor (IGFET) 12 from damage caused by high input voltages received through a pad 13. The protection circuit 10 comprises another IGFET 14 having its drain connected to the gate of the IGFET to be protected. The gate of the protection IGFET is connected to a reverse biased diode 16 connected to ground 18. In case of an ESD event, the protection IGFET 14 goes into an avalanche condition, where carrier injection from the drain to the gate occurs, the device switches to ON state, allowing carrier flow between drain and source, until the drain voltage drops below the avalanche maintenance value at which the charge built on the gate will be reduced through the diode 16, causing the protection device 14 to switch to OFF state again. The gate-drain and gate source Miller capacitances 20, 22 of the transistor 14 may provide a fast transient voltage divider enabling the protection transistor 14 in case of an ESD event. The diode is a resistive leakage path for discharging the gate capacity of the protection transistor 14, discharging slow enough for ESD events, fast enough for normal operation of the main circuit to be protected.

In US RE38,319 E, a dual-node capacitor coupled MOSFET for improving ESD performance is presented, allowing for ESD protection for a comparably low voltage range. A capacitor is connected between the gate of a protection circuit NMOS device and a pad, and the device is back biased via a resistor.

In U.S. Pat. No. 4,423,431, a semiconductor integrated circuit device providing a protection circuit is shown. The protection circuit consists of a protection transistor having a drain connected to a gate of a transistor to be protected. If an excessively high voltage is applied to the input gate, the protection transistor is turned ON to cause an electric charge to be passed to ground.

SUMMARY OF THE INVENTION

The present invention provides an integrated protection circuit for protecting a main circuit from spurious high amplitude voltage signals as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Identical reference numerals in different figures refer to identical or similar components.

DETAILED DESCRIPTION OF THE PREFERRED EMBODIMENTS

Because an integrated protection circuit implementing the present invention may, for the most part, be composed of electronic components and circuits known to those skilled in the art, circuit details will not be explained in any greater extent than that considered necessary for the understanding and appreciation of the underlying concepts of the present invention and in order not to obfuscate or distract from the teachings of the present invention.

Figure 2:
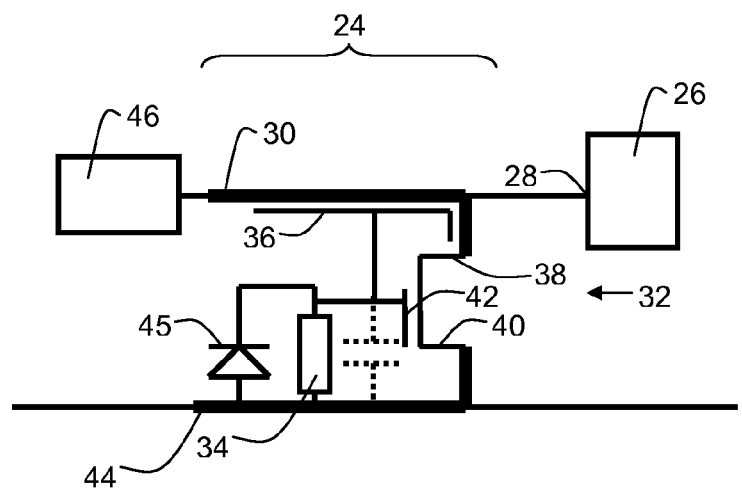
FIG. 2 shows a schematic diagram of a first example of an embodiment of an integrated protection circuit.

Referring to FIG. 2, a schematic diagram of a first example of an embodiment of an integrated protection circuit 24 is provided. An integrated protection circuit 24 for protecting a main circuit 26 from spurious high amplitude voltage signals is illustrated. The main circuit 26 has a main circuit input terminal 28 connected to an input line 30. The protection circuit 24 comprises a transistor 32, a resistor 34 and a capacitor 36. The transistor has a first electrode 38 connected to the input line 30, a second electrode 40 connected to a common reference 44, and a control electrode 42 connected to the resistor 34. The resistor 34 is connected to the common reference 44. The capacitor 36 is implemented as a fringe capacitor between the input line 30 and the control electrode 42 or a conductive line connected to the control electrode.

The term "connected" refers to two elements being electrically connected.

The input line 30 may be a conductive connection or a plurality of conductive connections between a pad 46 or pin and the main circuit input terminal 28 and the input first electrode 38 of the protection circuit transistor 32.

An electrode of a transistor may comprise a region on or in a substrate and a conductive connection for electrically accessing that region.

The common reference 44 may have ground, earth or any other stable potential.

A spurious voltage signal may for example be an unwanted, distracting voltage peak caused by an electrostatic discharge (ESD) event having a (positive or negative) amplitude potentially damaging the integrated circuit device. The spurious high amplitude voltage signals may be generated by ESD received on the input line. An ESD event may be caused for example by a person handling the IC device, e.g. when touching a pin or pad connected to the input line.

In the example shown in FIG. 2, the protection circuit 24 may be an active circuit comprising a transistor 32, a resistor 34 and a fringe capacitor 36. However, the protection circuit 24 may comprise a plurality of transistors, resistors, and fringe capacitors. Furthermore, the protection circuit may protect one or a plurality of main circuits.

The main circuit 26 or internal circuit may be any circuit, for example implemented on an integrated circuit chip. The main circuit input terminal 28 may be any input terminal or port of the main circuit, for example an input of a buffer amplifier, or more specifically a gate electrode of a transistor, for example belonging to an input stage of the main circuit 26.

In the example shown in FIG. 2, the protection circuit transistor 32 may be a metal-oxide semiconductor (MOS) transistor, for example an n-channel MOS field-effect transistor (NMOS-FET). However, it may be any other transistor, for example a PMOS-FET, or the shown transistor may comprise a complementary MOS-FET (CMOS) structure or for example an IGFET circuit. A MOS-FET may for example be a lateral double-diffused MOS-FET (LDMOS-FET). Or the shown transistor may comprise any structure having a plurality of identical, complementary or different transistors.

Figure 1:
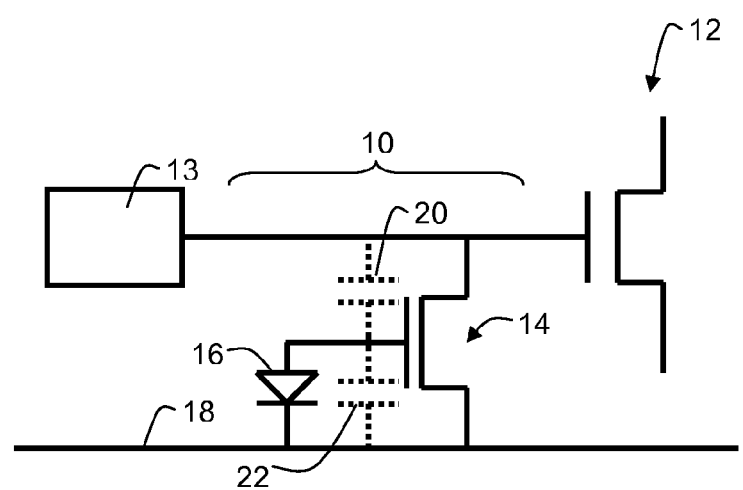
FIG. 1 shows a schematic diagram of a prior art protection circuit.

Therefore, as shown in FIG. 2, the first electrode 38 may for example be a drain, the second electrode 40 may be a source and the control electrode 42 may be a gate of the transistor. As an example, a critical environment for using integrated circuits may be an automotive application. ESD protection circuits may be required to protect high voltage modules handling about 40V of input voltage amplitude or more. A high amplitude voltage may refer to a highly positive or negative voltage value. Referring also to FIG. 1, the Miller capacitances of the protection transistor may be regarded as a fast transient voltage divider, enabling the protection device in case of an ESD event. Additional capacitors may be connected to the control electrode. This may require a large fraction of die area only for the ESD protection structure 24 itself. For example, for a 40V high voltage module, the size of the ESD structure may be as large as 0.1 mm$^2$, which may be more than 1% of the overall die size.

The term "fringe capacitance" may generally refer to a capacitance from the side wall of an object to any other object around it. Implementing an additional capacitor as fringe capacitor 36 between the input line 30 and the control electrode 42 or a conductive line connected to the control electrode, as shown in FIG. 2, may avoid the need for adding additional gate capacitor devices to the circuit, reducing the amount of protection circuit die area and allowing to withstand higher voltages than other gate capacitor devices would allow.

The resistor 34 shown in FIG. 2 connecting the control electrode 42 and the common reference line 44 may be any resistive device having a high resistance, slowing down discharging of the protection transistor control electrode 42, enabling the transistor 32 to allow let pass a high current between the first and the second transistor electrode 38, 40.

And the integrated protection circuit may comprise a diode 45 connected in parallel to the resistor, having its conducting direction towards the control electrode 42, allowing for negative pulse protection.

As shown in FIG. 2, in order to withstand high voltages, such as for example about 40V or more, a position of the control electrode 42 may be unsymmetrical relative to the first electrode 38 and the second electrode 40. In the shown example, the gate area may not be distributed symmetrically between the drain area and the source area on the semiconductor substrate. An increased distance between the gate and the drain may reduce a voltage drop between drain and gate, protecting the gate region from damage.

Unsymmetrical distribution of the gate region may be achieved by either shortening or displacing the gate region as compared to a gate region symmetrically distributed between drain and source. For example, an LDMOS-FET may have an unsymmetrical gate, for example when being used as a part of a power amplifier. However, this may reduce the Miller capacitance between the first electrode 38 and the control electrode 42, i.e. drain and gate in the shown example. Therefore, the fringe capacitor 36 may have a capacitance suitable for compensating a reduction in a Miller capacitance between the first electrode 38 and the control electrode 42 of the transistor 32 caused by the unsymmetrical position. Since the gate-drain Miller capacitance may be reduced, for example due to addition of a resistive path to withstand higher voltages on the drain side than the gate oxide may probably otherwise allow, a fringe capacitor 36 may be used to compensate the reduction of the gate-drain Miller capacitance.

The input line connecting the pad 46 with main circuit 26 and protection circuit 24 may receive a high current, for example during an ESD event, and may be implemented as a power routing to the main circuit 26 and the protection circuit 24.

As indicated in FIG. 2, the input line 30 and the common reference line 44 may at least partly be implemented as wide metal routing. This may improve the capability of sustaining high currents. For sustaining currents as high as 1 A or more, metal routings may be implemented, for example 10 times or 100 times or more, wider than the other connecting lines of the IC. For example, for a width of 0.32 µm of a common connecting line, a corresponding width of a wide metal line may be chosen as 30 µm.

Figure 3:
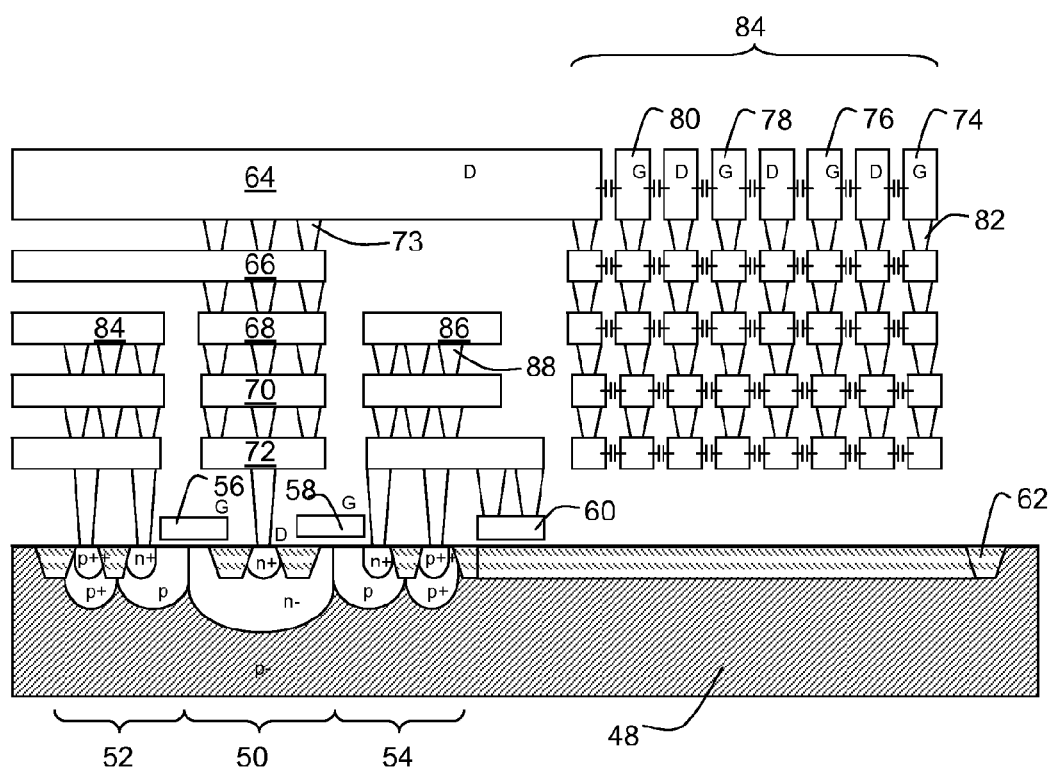
FIG. 3 shows a schematic diagram of a cross-sectional view of a second example of an embodiment of an integrated protection circuit.

Referring now also to FIG. 3, a schematic diagram of a cross-sectional view of a second example of an embodiment of an integrated protection circuit is shown. A semiconductor substrate 48 may contain n- and p-doped wells forming a drain 50 and a first 52 and second source region 54 controlled via gate electrodes 56, 58. As shown, drain, gate and source-regions may for example form two MOS-FET or a multi-finger MOS-FET. The source may be connected to a resistive device 60. The substrate may further comprise shallow trench isolation (STI) regions 62.

The input line may comprise a comb-shaped structure of conductive lines 64, 66, 68, 70, 72. A plurality of metal input lines, for example consisting of aluminium, connected using metal vias 73, for example consisting of titanium-tungsten, may be connected to form a connection to the drain region 50 of the substrate. Any other metal or conductive material may be used instead. The gate 56, 58 may also be connected to conductive metal lines 74, 76, 78, 80 interconnected using vias 82. A fringe capacitor 84 may be implemented by arranging conductive lines connected to the gate and conductive lines connected to the drain adjacent to each other, as shown in FIG. 3, forming a fringe capacitor 84, as indicated by the shown capacitor symbols. The source regions 52, 54 may be accessed using electrically interconnected 88 conducting lines 84, 86, too.

Figure 4:
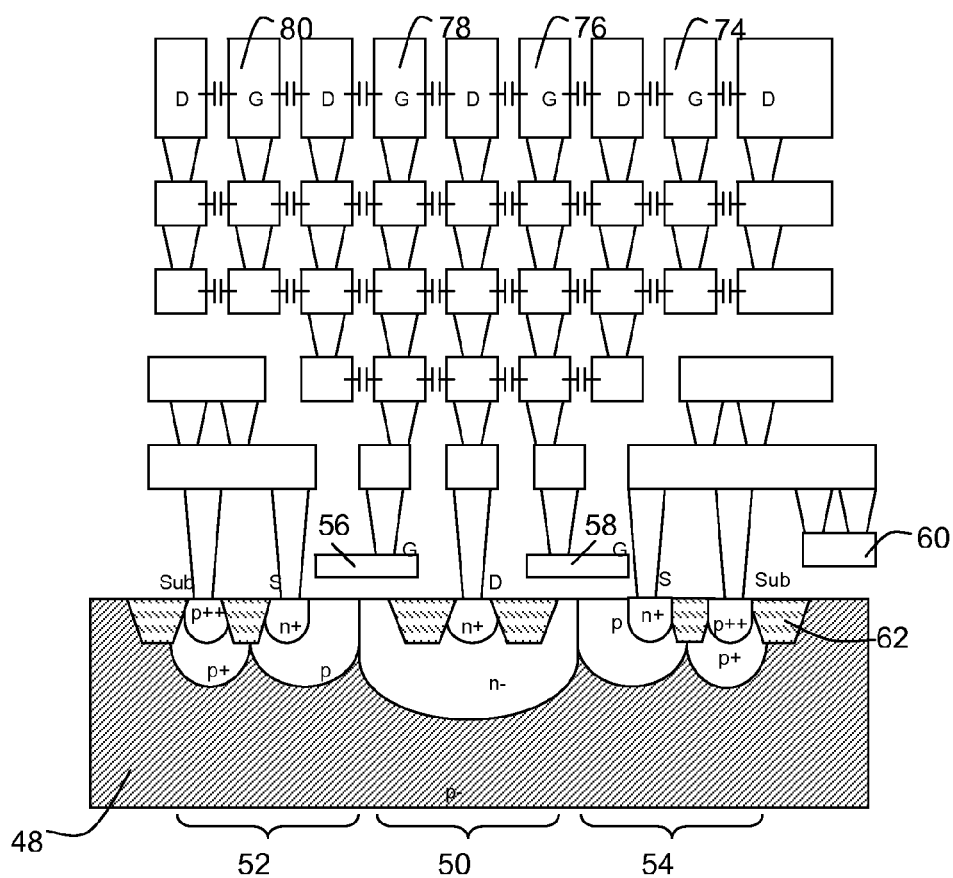
FIG. 4 shows a schematic diagram of a cross-sectional view of a third example of an embodiment of an integrated protection circuit.

Referring now also to FIG. 4, a schematic diagram of a cross-sectional view of a third example of an embodiment of an integrated protection circuit is shown. Only components different from the second embodiment shown in FIG. 3 will be described in detail. As illustrated, the fringe capacitor may be merged with the input line. In the shown example, the parts of the input line connected to the drain region 50 and connecting lines connected to the gate 56, 58 are directly used also for implementing the fringe capacitor. This may reduce the die area size required for implementing the protection circuit structure without impact in performance or function. The die area for the protection circuitry may for example be reduced by 30% or 40% or more, saving an overall die area of for example 0.4% or 0.5%, 1% or more, depending on the type of IC. Furthermore, this may reduce material consumption.

The fringe capacitor may be at least partially located over or above the transistor, reducing required die area and easing floor planning constraints during chip design. The shown integrated protection circuit may allow for compactness and overall saving of die area while being able to place a large capacitance between nodes of high voltage.

Just to give an example, the protection circuit as shown in FIG. 4 having a fringe capacitance of about 9.67 pF may receive a peak voltage of nearly 14V, e.g. caused by an ESD event, causing a gate voltage of less than 7V, that switches the protection circuit in an ON state and a current flow of nearly 2.5 A may be allowed between drain and source of the protective transistor.

Although the example embodiments described above illustrate the invention using MOS transistors, an integrated circuit device may comprise at least one protection circuit and one main circuit as described above, wherein the circuits are at least partly built using a BiCMOS process, combining bipolar junction transistors and CMOS technology into a single device. The BiCMOS process used may for example be Freescale's SMARTMOS process or any other BiCMOS process. Further, any process combining bipolar and MOS technology may be used.

The integrated protection circuit may be used in any device. For example a processing device may comprise an integrated circuit device or a protection circuit as described above. A processing device may for example be a microcontroller unit (MCU) or a microprocessor, a central processing unit (CPU), a graphics processor, a coprocessor, a digital signal processor (DSP), an embedded processor, an application specific integrated circuit (ASIC), a field programmable gate array (FPGA), an analogue-to-digital converter, etc.

Figure 5:
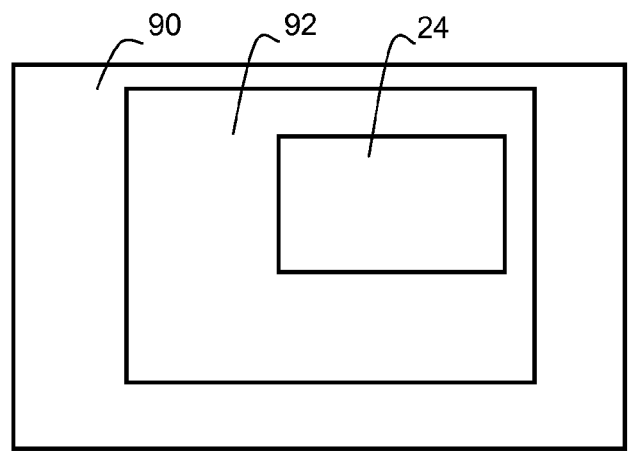
FIG. 5 shows a schematic diagram of an apparatus comprising a processing device comprising a protection circuit.

Referring now also to FIG. 5, a schematic diagram of an apparatus 90 comprising a processing device 92 comprising a protection circuit 24 is shown. The apparatus 90 may comprise a processing device 92 or an integrated circuit device or a protection circuit 24 as described above. An apparatus 90 may for example be a vehicle, for example a car, a plane, a ship, a helicopter etc. The apparatus 90 may comprise a system, for example a safety critical system in an automotive environment, employing a processing device, whose failure may result in a dangerous situation. A safety critical system may be, for example, a car safety system. A safety critical system may comprise a seat position control system, lighting, windscreen wipers, immobilizers, electronic climate control, a brake system or an electrical steering system. A brake system may comprise, for example, an anti-lock braking system (ABS), an electronic brakeforce distribution system (EBD), a cornering brake control (CBC) system etc. An electrical steering system may comprise, for example, an electronic stability control system (ESC), a traction control system (TCS) or anti-slip regulation system (ASR), an adaptive cruise control (ACC) system, a forward collision warning (FCW) system etc. However, the semiconductor device having an integrated protection circuit may also be used for other car systems, such as the dashboard. The integrated protection circuit may comply with standards such as ESD protection standard AEC-Q100 provided by the Automotive Electronics Council (AEC).

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Furthermore, the semiconductor substrate 48 described herein can be any semiconductor material or combinations of materials, such as gallium arsenide, silicon germanium, silicon, monocrystalline silicon, the like, and combinations of the above, just to name a few.

Also, although the invention has been described with respect to specific conductivity types or polarity of potentials, skilled artisans appreciated that conductivity types and polarities of potentials may be reversed.

Furthermore, the conductive lines may be implemented in a different manner than shown in the examples.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While the principles of the invention have been described above in connection with specific apparatus, it is to be clearly understood that this description is made only by way of example and not as a limitation on the scope of the invention.

The invention claimed is:

1. An integrated protection circuit for protecting a main circuit from spurious high amplitude voltage signals, said integrated protection circuit comprising:
   a transistor, a resistor and a capacitor, wherein;
      said transistor comprises
         a first electrode connected to an input line coupled to a main circuit input terminal of said main circuit,
         a second electrode connected to a common reference, and
         a control electrode connected to said resistor, wherein a position of said control electrode is unsymmetrical relative to said first electrode and said second electrode;
      said resistor further connected to said common reference, and
      said capacitor is a fringe capacitor coupled between said input line and said control electrode or a conductive line connected to said control electrode.

2. The integrated protection circuit as claimed in claim 1, further comprising:
   a diode connected in parallel to said resistor, wherein the diode has a conducting direction towards said control electrode.

3. The integrated protection circuit as claimed in claim 1, wherein said fringe capacitor is configured with a capacitance that compensates for a reduction in a Miller capacitance between said first electrode and said control electrode of said transistor caused by said unsymmetrical position.

4. The integrated protection circuit as claimed in claim 1, wherein said input line is a power routing to said main circuit and said protection circuit.

5. The integrated protection circuit as claimed in claim 1, wherein said input line comprises a comb-shaped structure of conductive lines.

6. The integrated protection circuit as claimed in claim 1, wherein said fringe capacitor is merged with said input line.

7. The integrated protection circuit as claimed in claim 1, wherein said fringe capacitor is at least partially located over said transistor.

8. The integrated protection circuit as claimed in claim 1, wherein said spurious high amplitude voltage signals are generated by electrostatic discharge (ESD) received on said input line.

9. An integrated circuit device comprising at least one protection circuit and one main circuit as claimed in claim 1, wherein said circuits are at least partly built using a BiCMOS process.

10. A processing device, comprising an integrated circuit device as claimed in claim 9.

11. An apparatus, comprising a processing device as claimed in claim 10.

12. A method comprising:
   providing a transistor to implement an integrated protection circuit for protecting a main circuit from spurious high amplitude voltage signals, the transistor comprising:
      a first electrode connected to an input line coupled to a main circuit input terminal of said main circuit,
      a second electrode connected to a common reference, and
      a control electrode, wherein a position of said control electrode is unsymmetrical relative to said first electrode and said second electrode;
   providing a resistor to connect said control electrode and said common reference; and
   providing a fringe capacitor to couple said input line and said control electrode.

13. The method of claim 12, further comprising:
   providing a diode connected in parallel with said resistor, wherein the diode has a conducting direction towards said control electrode.

14. The method of claim 12, wherein said fringe capacitor compensates for a reduction in a Miller capacitance between said first electrode and said control electrode of said transistor caused by said unsymmetrical position.

15. An integrated protection circuit for protecting a main circuit from spurious high amplitude voltage signals, said integrated protection circuit comprising:
   a transistor, a resistor and a capacitor, wherein;
      said transistor comprises
         a first electrode connected to an input line coupled to a main circuit input terminal of said main circuit,
         a second electrode connected to a common reference, and
         a control electrode connected to said resistor;
      said resistor further connected to said common reference, and
      said capacitor is a fringe capacitor coupled between said input line and said control electrode, wherein said fringe capacitor is configured with a capacitance to supplement a Miller capacitance between said first electrode and said control electrode of said transistor.

16. The integrated protection circuit as claimed in claim 15, further comprising:
   a diode connected in parallel to said resistor, wherein the diode has a conducting direction towards said control electrode.

17. The integrated protection circuit as claimed in claim 15, wherein a position of said control electrode is unsymmetrical relative to said first electrode and said second electrode.

18. The integrated protection circuit as claimed in claim 15, wherein said fringe capacitor is at least partially located over said transistor.

* * * * *